United States Patent [19]

Costello

[11] Patent Number: 5,588,996
[45] Date of Patent: Dec. 31, 1996

[54] APPARATUS FOR SPRAY COATING FLAT SURFACES

[75] Inventor: Bernard J. Costello, Princeton, N.J.

[73] Assignee: Argus International, Ringoes, N.J.

[21] Appl. No.: 222,125

[22] Filed: Apr. 1, 1994

[51] Int. Cl.⁶ .................................................. B05C 11/00
[52] U.S. Cl. ..................... 118/668; 118/300; 118/323; 118/324; 239/130; 239/134; 239/142; 239/175
[58] Field of Search ........................ 118/668, 324, 118/300, 323; 239/130, 134, 142, 175

[56] References Cited

U.S. PATENT DOCUMENTS

| | | | |
|---|---|---|---|
| 3,526,207 | 9/1970 | Nadelson | 118/50 |
| 4,425,868 | 1/1984 | Shapiro | 118/34 |
| 4,558,657 | 12/1985 | Rohrbach | 118/70 |
| 4,607,590 | 8/1986 | Pender | 118/314 |
| 4,611,554 | 9/1986 | Mahlkow et al. | 118/316 |
| 4,614,660 | 9/1986 | Weibye | 426/461 |
| 4,695,482 | 9/1987 | Weiswurm | 427/96 |
| 4,836,137 | 6/1989 | Heine et al. | 118/663 |
| 4,947,787 | 8/1990 | Grah et al. | 118/64 |
| 4,949,665 | 8/1990 | Weber | 118/66 |
| 5,205,869 | 4/1993 | Ahern | 118/324 |
| 5,221,341 | 6/1993 | Heine | 118/630 |
| 5,232,501 | 8/1993 | Pender et al. | 118/300 |
| 5,256,200 | 10/1993 | Poulson et al. | 118/323 |
| 5,288,323 | 2/1994 | Pender | 118/314 |
| 5,368,219 | 11/1994 | Hogan et al. | 228/33 |
| 5,393,348 | 2/1995 | Morris | 118/668 |

*Primary Examiner*—Nina Bhat
*Attorney, Agent, or Firm*—Louis Weinstein

[57] ABSTRACT

Apparatus for coating a workpiece such as a printed circuit board. Boards are arranged in closely spaced fashion upon a conveyor having an adjustable drive. A spray assembly for providing a low pressure spray having a substantially oval-shaped spray pattern is arranged upon guide tracks and moves in a reciprocating fashion in a direction transverse to the direction of movement of the conveyor. The speed of movement of the spray head and the extreme ends of the range of movement are adjustable by controlling the operation of a drive motor to create a substantially Z-shaped spray pattern on the workpiece with the size of the Z-shaped pattern being a function of the conveyor speed spray head assembly, drive speed and range of movement of the spray head assembly. Control may be exerted by a microprocessor based computer system receiving input information regarding size of workpiece, thickness of coating and the like for automatically controlling the conveyor motor and the spray assembly motor thus further simplifying the speed and ease of setup changes as well as significantly reducing waste of coating material and the like.

34 Claims, 2 Drawing Sheets

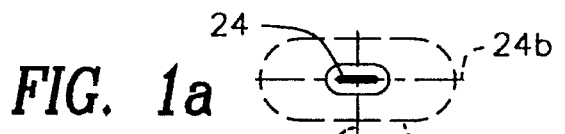
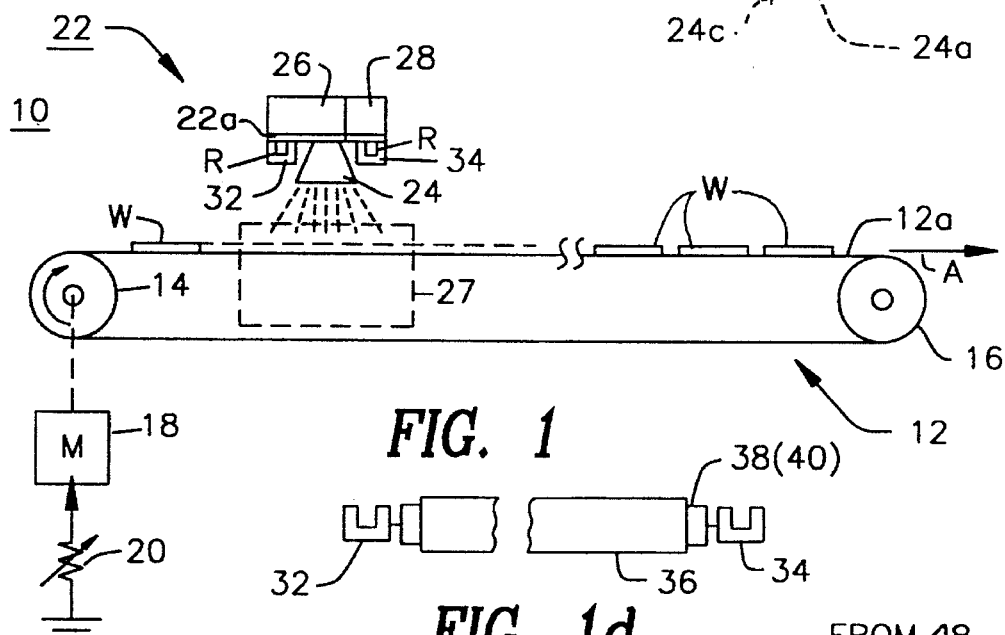
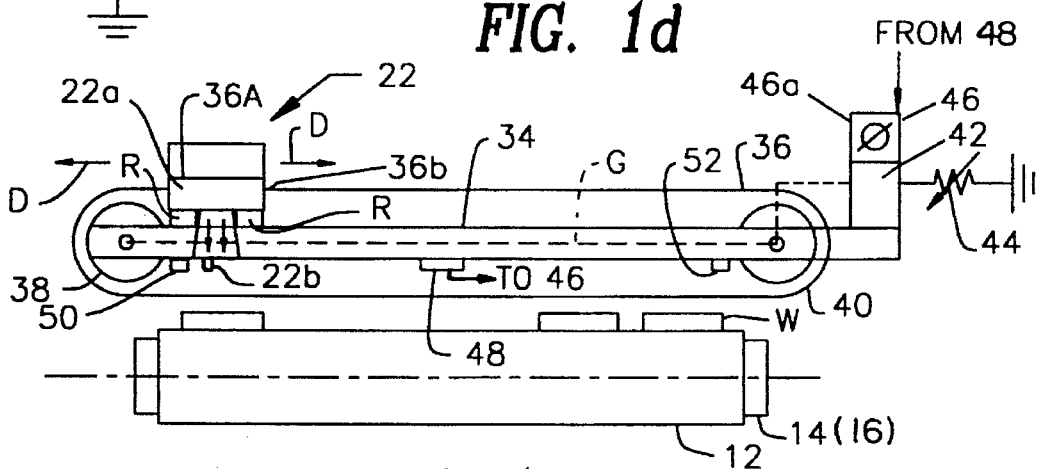
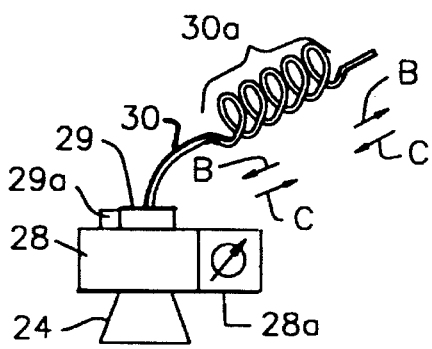
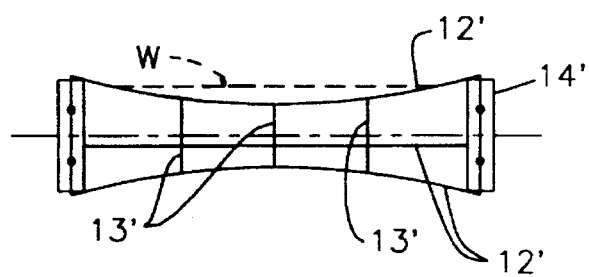

APPARATUS FOR SPRAY COATING FLAT SURFACES

FIELD OF THE INVENTION

The present invention relates to spray coating of flat surfaces with a paint-like material and more particularly to coating a printed circuit board with a liquid photoresist which is subsequently dried and imaged to produce a primary image or solder mask. The method and apparatus is also applicable for coating circuit assemblies with conformal coating material to protect circuits from mechanical damage and/or corrosion.

BACKGROUND OF THE INVENTION

A number of methods have been used in the past and are still presently in use for coating printed circuits. One of the most widely used methods is screen printing wherein a surface area of a board to be coated is defined by an opening in the screen device. Coating material is applied to the screen and is urged through the opening by the wiping action of a squeegee drawn across the screen. The amount of material deposited on the surface is determined by screen dimensions, material rheology and the speed of the squeegee traversing the screen. Whereas the screen method has the advantages of being accurate, fast and repeatable, disadvantages reside in the need to provide a specific screen for a specific board size, the complicated setup needed to establish machine parameters and the limited life of a screen.

A second method in popular use is curtain coating. In practice, a web of liquid is caused to fall from a metering device in a known and controlled geometry. The web is situated transverse to a conveyor or similar handling mechanism. The workpiece passes beneath the web and intersects the falling liquid and collects a controlled amount of falling liquid along an upper surface of the workpiece. Whereas curtain coating has the advantages of high productivity and minimal setup when changing from one board size to another, disadvantages reside in the fact that the equipment is not easily turned off and on again for short-run work, the equipment is relatively expensive in terms of capital required and the technique requires a large charge of material for proper operation. When thin coatings are desired, there is a tendency to skip and thereby not completely and properly cover the surface to be protected.

A third method of application is electrostatic spray which requires an electrically conductive material. A voltage is applied between the spray device and the surface being coated. An electric field created by the applied voltage causes the coating material particles to be accelerated and attracted to the surface being coated. Whereas advantages reside in the ability to completely coat the surface with negligible setup, the disadvantages are: high initial costs; tendency to waste material due to overspray; potential for electrical discharge and operator hazard to high voltage in the work area.

BRIEF DESCRIPTION OF THE INVENTION

The present invention is characterized by the employment of low pressure air spraying techniques for the application of liquid to the surface of a printed circuit board. The techniques provided are designed with an objective to require only minimal setup and/or equipment changes to accommodate changes in production. The system apparatus comprises a conveyor for carrying the workpiece, a spray gun for applying coating material, and an exhaust system to control air flow and overspray in the work area.

Workpieces are preferably moved horizontally along a conveyor means which is preferably an open mesh structure having a depression in the center or on edge conveyors to provide support to the side edges of the part. Work is preferably placed in the center of the conveyor means with the leading and trailing edges of parts in close proximity to minimize spray losses between the parts or workpieces.

The spray gun is positioned above the moving plane of the workpiece and is pointed downwardly toward the surface of the workpiece.

The spray pattern of the spray gun is preferably oval in shape with a ratio of the oval dimensions being about five to one such that the width of the pattern is about ⅕ that of the length or longitudinal dimension, which is aligned to be substantially parallel to the direction of workpiece travel.

The spray gun is mounted on a cart movable transverse to the direction of workpiece travel. The cart is driven by a variable speed motor. During operation the gun is caused to travel across the path of the workpiece while spraying the coating material onto the workpiece surface. At the extremes of travel of the spray gun, the drive motor is reversed causing the travel of the spray gun to reverse. Velocity and distance of travel of the spray gun and the speed of the workpiece results in a "Z-shaped" path described by the spray gun relative to the workpiece. The width and pitch of the Z-shaped path are determined by the relative speeds of the spray gun and the workpiece. The oval pattern of the spray and the pitch of the Z-shaped path are adjusted to eliminate apparent non-uniformity by causing successive passes of the spray pattern to overlap and eliminate non-uniform spray coating.

The traverse mechanism determines the width of the spray pattern by reversing direction at the extremes of travel, which is adjustable.

The design of the system is such as to enable setup changes to be made quickly and easily to accommodate changes in workpieces being processed. One preferred technique for accomplishing this result is to provide a proximity switch which detects the position of the moving cart and initiates a timer to control movement of the spray gun from a center position to the outer extreme positions. The timer is adjustable to adjust the distance of the extreme position from the center point. Speed of movement is adjusted by adjusting the drive motor. The timing functions may vary to accommodate asymmetric shapes of work. Given the velocity of the spray gun, the excursion, the speed of the conveyor and fluid properties are all known, this data may be manipulated by an embedded computer which computes speeds as a function of fluid thickness, for example, thus minimizing operator control and further expediting setup changes.

OBJECTS OF THE INVENTION

It is therefore an object of the present invention to provide method and apparatus for effectively coating printed circuit boards and the like and especially providing method and apparatus for effectively applying thin coatings of liquid.

Another object of the present invention is to provide a novel spraying method for uniformly spray coating printed wiring boards and the like and which is designed to facilitate fast and easy setup changes.

Another object of the present invention is to provide a novel spraying method for uniformly spray coating printed wiring boards and the like and which is designed to reduce costs for coating apparatus.

Another object of the present invention is to provide a novel spraying method for uniformly spray coating printed wiring boards and the like and which is designed to minimize wasting of spray material.

Still another object of the present invention is to provide a novel method and apparatus for coating printed circuit boards and the like including means for automatically traversing workpieces carried upon a conveyor with a predetermined coating spray pattern so as to traverse a substantially Z-shaped spray pattern relative to the workpiece wherein the shape of the pattern is a function of conveyor speed and a traversal speed of the spray gun and wherein the length and width of the pattern are quickly and easily adjustable thus significantly simplifying setup changes.

BRIEF DESCRIPTION OF THE FIGURES

The above, as well as other objects of the present invention, will become apparent when reading the accompanying description and drawings in which:

FIG. 1 is a longitudinal side elevational view of spray apparatus embodying the principles of the present invention.

FIG. 1a shows a typical spray pattern for the spray head of FIG. 1.

FIG. 1b shows an end elevational view of the apparatus of FIG. 1 showing the spray assembly drive control in greater detail.

FIG. 1c shows an alternative liquid spray supply means usable in the apparatus of FIG. 1.

FIG. 1d shows the manner in which rollers for the spray assembly drive control belt are arranged between guide tracks of the spray assembly of FIGS. 1 and 1b.

FIGS. 1e and 1g show alternative conveyor belt arrangements for use in the conveyor employed in the system of FIG. 1.

DETAILED DESCRIPTION OF THE INVENTION AND PREFERRED EMBODIMENTS THEREOF

Figure 1F:
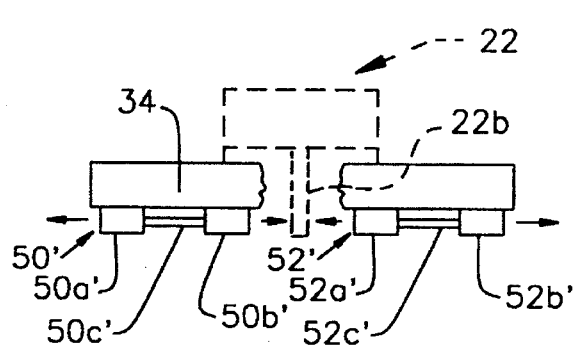
FIG. 1f shows an alternative sensor arrangement which may be employed in the drive control system for the spray assembly of FIG. 1b.
Figure 1I:
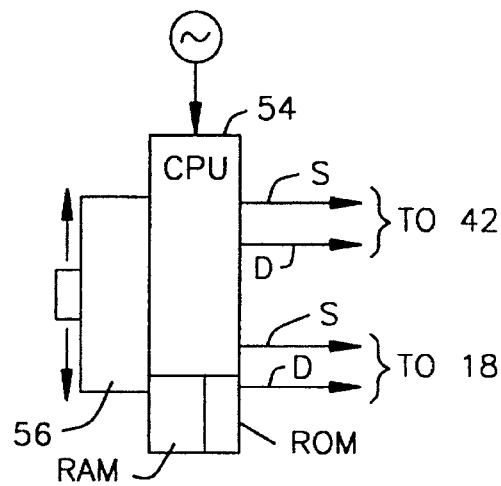
FIG. 1i shows a microprocessor-based control system for controlling the operation of the system of FIGS. 1 and 1b.
Figure 1H:
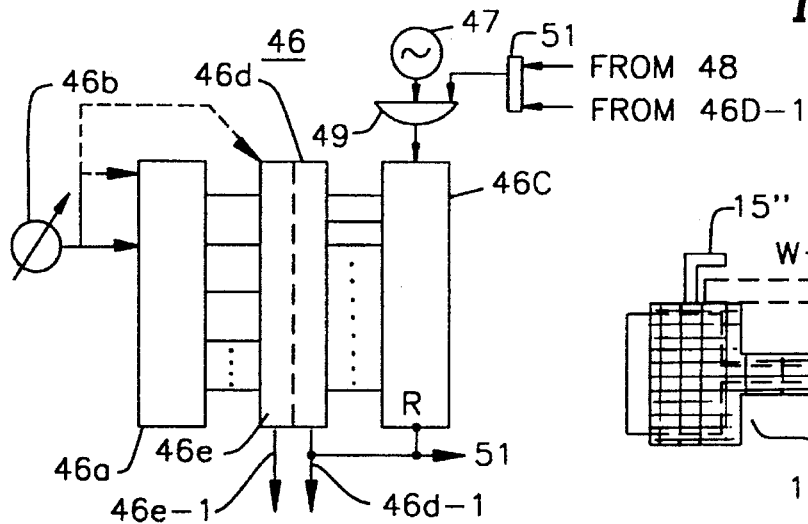
FIG. 1h shows one technique for controlling the operation of motor 42 of FIG. 1b.

FIG. 1 shows a system 10 embodying the principles of the present invention and comprising a conveyor belt 12 entrained about upstream and downstream rollers 14 and 16, respectively. The upper run 12a supports workpieces W which may be of any shape and size that can be accommodated by the conveyor system. In addition to closely spacing workpieces W in the direction of movement as shown by arrow A, workpieces W may be closely spaced side by side in a direction transverse to the direction of movement as shown in FIG. 1b. The belt may be fabric or wire of open or closed mesh.

The conveyor is driven by an adjustable speed motor 18 whose speed may be adjusted, for example, by a potentiometer 20 to obtain a Z-shaped pattern of an adjustable size, as will be more fully described. The speed of motor 18 may be controlled by either adjusting an input voltage or an input current. Any other adjustable speed motor may be used, if desired.

The spray head assembly 22 is positioned above upper run 12a and includes a spray head 24 coupled to a liquid source 26 pumped into spray head 24 by a pump 28 to provide a low pressure liquid spray. As an alternative, liquid source 26 may be a stationary source (not shown) positioned at a location adjacent to the conveyor and coupled through a flexible tube 30 to spray head 24 by pump 28, as shown in FIG. 1c. The tube is sufficiently flexible so as to provide a continuous flow of fluid to spray head 24 without kinking. For example, an intermediate portion 30a of tube 30 may be coiled and be free to respectively expand and contract as shown by arrow sets B and C to accommodate reciprocating movement of the spray assembly in the direction transverse to workpiece movement (see arrow A) to accommodate movement of the spray assembly between its opposite extremes. The pump 28 and/or a valve control 29 may be adjustable by an adjustable control 28a and valve control 29a (see FIG. 1c) to provide additional controls for obtaining a desired coating.

The spray assembly may be provided with a chassis 22a upon which members 24 and 26 and 28 are mounted. The chassis is provided with rollers R which extend into the grooves G of a pair of guide rails 32, 34 to guide assembly 22 and prevent lateral movement. The spray assembly is movable in a direction transverse to the direction of movement of conveyor belt upper run 12a as shown by arrows D in FIG. 1.

A closed loop drive belt 36 is entrained about a pair of drive belt rollers 38, 40 arranged at opposite ends of tracks 32 and 34 and extending between the tracks as shown in FIG. 1d. The rollers 38 and 40 are freewheelingly mounted.

A drive motor 42 mounted at one end of the tracks 32 and 34 which extend, for example, beyond the right-hand end of workpiece conveyor belt 12 drives roller 40 which in turn moves drive belt 36. The ends 36a and 36b of drive belt 36 are secured to opposite sides of spray assembly chassis 22a.

Motor 42 is provided with a speed adjustment means which may, for example, be an adjustable potentiometer 44 and further includes adjustable timing means 46 having an adjustment knob 46a and receiving a timer initiating signal from proximity sensor 48 which senses a probe or projection 22b extending downwardly from spray assembly 22 to pass in close proximity to sensor 48. Extremity sensors 50 and 52 are further provided at the extreme ends of the tracks for a purpose to be more fully described. The sensors may be proximity sensors, optical sensors or microswitches having switch arms which are closed when slidably engaged by probe 22b when it passes a switch arm.

Exhaust system 27 shown in dotted fashion in FIG. 1 controls airflow and overspray. FIG. 1j shows an end view of the exhaust system which has an inverted U-shaped configuration and is positioned beneath upper run 12a. A vacuum is drawn through conduits 27a–27b, which are coupled to a vacuum (or blower source, not shown). Openings along side surfaces 27c and 27d draw air and overspray into the interior 27f of the exhaust system enclosure and out through conduits 27a, 27b. Filters may be employed as shown. If desired, the sides 27c, 27d and 27e may be completely open.

The exhaust system is preferably used to support the guide tracks 32–34.

The operation of the spraying system of the present invention is as follows:

Workpieces are arranged upon the upstream (left hand) end of conveyor upper run 12a (see FIG. 1) and a position in close proximity so as to avoid wasteful use of spray. Depending upon the size and shape of workpieces, workpieces may be arranged side by side in a direction transverse to the direction of movement A of conveyor upper run 12a (see FIG. 1b).

Motor 18 is energized and motor speed of the motor is adjusted at potentiometer 20 to adjust the linear speed of conveyor upper run 12a.

Spray head 24 is arranged so that its oval-shaped spray pattern 24a (see FIG. 1a) so that the longitudinal axis 24b of the spray pattern is aligned substantially parallel to the direction of movement of workpieces represented by arrow A and so that the width dimension of the spray pattern represented by transverse axis 24c is substantially perpendicular to the direction A. A ratio of 5:1 of length to width of the spray pattern is preferred. The ratio may be modified, so long as the length dimension is greater than the width dimension.

The timer 46 of motor 44 is adjusted to a predetermined time interval and the operating speed of drive motor 42 is adjusted by potentiometer 44.

Assuming that the spray assembly 22 moves toward the right relative to FIG. 1b, the probe 22b on passing proximity sensor 48 causes a pulse to be applied to timer unit 46. This pulse initiates the timer which times out according to the interval selected by adjustment knob or control 46a. Upon reaching the end of the selected time interval, the timer times out, automatically reversing the rotational direction of drive motor 42 thereby reversing the direction of movement of the spray assembly 22.

In moving toward the left, the probe 22b again passes proximity sensor 48 causing initiation of the operation of timer 46. When the time period times out, the timing unit reverses direction of motor 42 causing the spray assembly to move from left to right.

Additional extremity sensors 50 and 52 may be provided, if desired. The extremity sensors can be utilized either to automatically stop motor 42 or alternatively to stop and reverse motor 42. Sensors 50 and 52 may be located at the extremities of the range of permissible movement thereby, for example, protecting against continuous movement of the spray assembly due to the failure of the proximity sensor 48 to detect the passage of probe 22b.

As another alternative, the extremity sensors 50 and 52 may be slidably mounted along the support and track assembly and moved and manually moved to a desired position.

As another alternative, shown in FIG. 1f, each of the extremity sensors 50 and 52 may alternatively comprise a pair of sensors, for example, sensor assembly 50' may be comprised of a pair of sensors 50a' and 50b' spaced a predetermined distance apart by a spacing member 50c'. Similarly sensor assembly 52' may comprise a pair of sensors 52a', 52b' spaced apart by a spacer 52c'. Sensor assemblies 50' and 52' are movable along the track supporting assembly and, as spray assembly 22 moves toward the right in FIG. 1f, probe 22b passes sensor 52a' which causes the motor to decelerate. As the motor is decelerating, it comes in the vicinity of proximity sensor 52b' which causes the motor to stop and reverse direction. In moving from the right to the left, as probe 22b passes sensor 52a' the motor is accelerated to the maximum selected speed. The arrangement of FIG. 1f may be used either with or without a centrally located sensor 48. Alternatively, sensor assemblies 50' and 52' may consist of only one sensor, eliminating the decelerating sensor.

Figure 1G:
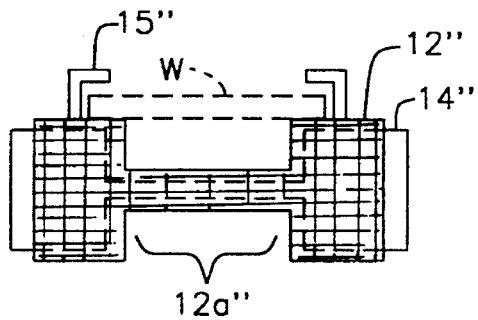
Figure 1J:
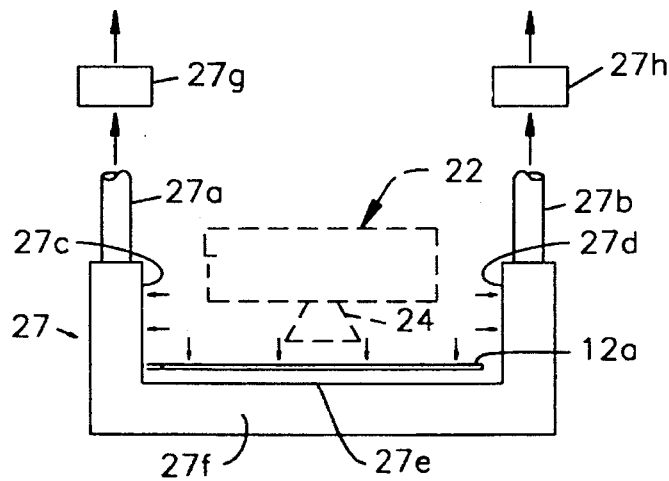
FIG. 1j is an end view showing the exhaust system employed in the system of FIG. 1 in greater detail.

FIG. 1g shows one embodiment of a timer arrangement. Timer 46 is comprised of a register 46a for inputting a digital representation of a numeric analog input through adjustable means 46b.

Oscillator 47 applies incrementing pulses to counter 46c through gate 49 responsive to an output from a bistable flip-flop circuit 51 which opens gate 49 to provide accumulating pulses to counter 46c. When the count in counter 46c is the same as the count in register 46a, comparator 46d develops an output at 46d-1 which is simultaneously applied to a reset input of counter 46c to reset the counter and is applied to a reset input for bistable flip-flop 51.

The comparator may comprise, in addition to comparator 46d, a second comparator 46e which compares the count in counter 46c against a value which is a predetermined numeric quantity less than the value set into a register portion 46a-1 by input 46b whereupon a signal is developed when the count in counter 46c reaches its lower count which signal appears at output 46e-1 to cause the motor to slow down a predetermined time before reaching the count value set in to register 46a representing the extreme end of the range of movement selected according to the workpieces being treated.

As shown in FIG. 1g, the system control may comprise a CPU 54 receiving variable input information from input means 56 and containing a stored program in a ROM and having a RAM memory. Suitable algorithms are provided in the CPU for automatically selecting the drive speed of motors 18 and 42 by inputting information including the thickness of the desired coating, the nature of the coating material and the width of workpieces arranged in the direction transverse to the direction of movement of conveyor 12. This information is utilized to compute control signals provided to motors 18 and 42. For example, motor speed S and motor direction D may be provided as outputs to motors 18 and 42 as shown in FIG. 1g.

The conveyor belt 12 may be any suitable conveyor material. However, conveyor belt 12 is preferably an open mesh wire structure depressed in the center to provide support to the side edges of the workpiece. For example, the belt may be comprised of longitudinal wires 13' and cross wires 12', wires 12' being bent in a gently curved arrangement arranged to pass about sprockets 14', 14' as shown in FIG. 1e.

As another alternative, the depression may be more pronounced and "squared-off" as shown by the conveyor belt 12w' in FIG. 1g. The roller 14" may have a similar shape, or may be replaced with sprockets (see FIG. 13). FIG. 1g shows a workpiece supported thereon.

As a further alternative, the center section 12a" (FIG. 1g) may be removed whereupon the boards are supported by "edge" conveyors. By the use of clamping members at spaced intervals along the edge conveyor, only one edge conveyor need be used. See one such clamp 15" in FIG. 1g.

The spray liquid may be a photoresist, a conformal protective coating or any other liquid coating typically applied to printed circuit boards. The boards may be coated before or after having components assembled thereon.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. Apparatus for coating workpieces comprising:

conveyor means for conveying workpieces in a given direction;

means for moving said conveyor means including means for adjusting the moving speed of said conveyor means;

a spray assembly including a spray head for producing a liquid spray in a given pattern;

means for delivering a coating liquid to said spray assembly;

means for reciprocably mounting said spray assembly above said conveyor means to deliver a liquid spray from said spray head downwardly toward an upper surface of a workpiece arranged on the conveyor means, said spray assembly being movable in a reciprocating fashion along a path transverse to said given direction;

means for reciprocating said spray assembly as said conveyor means is moving workpieces beneath said spray assembly and said spray assembly emits a spray of coating liquid;

means for adjusting the moving speed of said reciprocating means; and means for adjusting outer limits of reciprocating movement of the spray assembly along said transverse path according to size and/or arrangement of workpieces on the conveyor means to maximize efficient use of spray liquid and reduce waste thereof as well as facilitating setup changes of said apparatus to accommodate different coating thicknesses and workpieces of differing sizes.

2. The apparatus of claim 1 wherein said reciprocable mounting means comprises a track assembly extending in said transverse direction;

said spray assembly having means guided by said track assembly to constrain linear movement of said spray assembly along said path and prevent movement lateral to said path.

3. The apparatus of claim 1 wherein said means for moving the conveyor means comprises motor means and said means for adjusting the moving speed of said conveyor means comprises means for adjusting an output speed of said motor means.

4. The apparatus of claim 3 wherein said means for adjusting an output speed comprises means for adjusting the voltage and/or current applied to said motor means.

5. The apparatus of claim 1 wherein said spray head includes means for providing a substantially oval-shaped spray pattern.

6. The apparatus of claim 5 wherein said oval-shaped spray pattern has a longitudinal dimension extending along a longitudinal axis which is substantially parallel to said given direction and a latitudinal width measured along a latitudinal axis perpendicular to said given direction;

said longitudinal length being greater than said latitudinal length.

7. The apparatus of claim 6 wherein the longitudinal length is five times greater than the latitudinal width.

8. The apparatus of claim 1 wherein said conveying means comprises an open mesh conveyor belt for supporting workpieces;

said conveyor belt being entrained about at least a pair of rollers;

said means for moving the conveyor means comprising motor means coupled to drive at least one of said rollers and said means for adjusting the speed of said conveyor means including means for controlling the output speed of said motor means.

9. The apparatus of claim 1 wherein said spray assembly comprises:

flexible conduit means for conveying a spray liquid to said spray head from a liquid source remote from said reciprocating spray assembly, said conduit means being yieldable to permit movement of an outlet end of said conduit means relative to an inlet end so that reciprocating movement of the spray assembly does not affect the continuous low pressure flow of liquid.

10. The apparatus of claim 1 wherein said means for delivering a coating liquid further comprises a source of spray liquid and means for delivering spray liquid to said spray head at a low pressure.

11. The apparatus of claim 10 wherein the means for delivering spray liquid is adjustable to control a flow of liquid from said spray head.

12. The apparatus of claim 11 wherein said means for delivering a coating liquid further comprises elongated flexible conduit means coupled between said spray head and a source of spray liquid arranged remote from said spray assembly; and means for conveying said spray liquid from said source of spray liquid to said spray head through said conduit means at a low pressure;

said flexible conduit means being of a length sufficient to accommodate reciprocating movement of said spray assembly without affecting delivery of fluid to said spray head.

13. The apparatus of claim 1 wherein said reciprocating means further comprises:

a spray assembly drive conveyor entrained about a pair of rollers supported by said track assembly, said spray assembly including a chassis coupled to said drive belt;

a spray assembly drive motor means coupled to rotate at least one of said rollers supporting said drive belt; and said means for adjusting the moving speed of the means for reciprocating including means for adjusting the output speed of said spray assembly drive motor.

14. The apparatus of claim 13 further comprising sensor means positioned along said path for sensing passage of said spray assembly to generate a control pulse;

means for adjusting a range of reciprocating movement of said spray assembly comprising means responsive to a control pulse for controlling said drive motor to drive said spray assembly in a given direction and to reverse the direction of movement of said spray assembly after a predetermined time interval responsive to said control pulse.

15. The apparatus of claim 13 wherein said predetermined time interval is determined by adjustable timing means which initiates a timed period responsive to said control pulse.

16. The apparatus of claim 1 wherein said means for adjusting outer limits of a range of reciprocating movement of the spray assembly along said path comprise slidably mounted sensors for detecting presence of the spray assembly to reverse direction of an output of a drive motor forming part of said means for moving said conveyor means;

said sensors being slidably positionable along said path.

17. The apparatus of claim 16 wherein said sensors are proximity sensors.

18. The apparatus of claim 16 wherein said sensors are switch means closed by sliding engagement with a probe of said spray assembly as it passes said switch means.

19. The apparatus of claim 17 wherein said spray assembly is provided with a projecting probe which is positioned in close proximity to said proximity sensors when said spray assembly is passing a proximity sensor for actuating a proximity sensor.

20. The apparatus of claim 18 wherein said sensors are microswitches and said spray assembly is provided with projecting means for activating a microswitch as said spray assembly is passing a microswitch.

21. The apparatus of claim 1 further comprising exhaust means for regulating airflow and overspray in the spray region.

22. The apparatus of claim 21 wherein said exhaust means is arranged beneath said conveyor means for drawing air and/or spray directed toward both longitudinal sides of said conveyor means and directed downwardly and through said conveyor means to an exhaust outlet.

23. The apparatus of claim 1 wherein said conveyor means comprises edge conveyor means for supporting at least one edge of a workpiece moving beneath the spray assembly.

24. The apparatus of claim 1 wherein said spray assembly mounting means includes means to maintain said spray assembly a given distance away from said conveyor means as said spray assembly is being reciprocated.

25. The apparatus of claim 1 wherein said conveyor means moves said workpiece along a path lying in a given plane and said means for reciprocally mounting said spray assembly includes means for limiting movement of the spray assembly along a path substantially parallel to said given plane as said spray assembly is being reciprocated.

26. The apparatus of claim 25 wherein said given plane is a substantially horizontal plane.

27. The apparatus of claim 1 wherein said means for delivering a coating liquid to said spray assembly provides a substantially continuous spray fluid to the spray head during reciprocating movement of the spray head.

28. The apparatus of claim 1 wherein said means for delivering a coating liquid comprises a low pressure air spray means.

29. The apparatus of claim 1 wherein said conveyor means moves said workpieces along a substantially horizontal path and said path of movement of said spray assembly is substantially horizontal and transverse to the path of movement of workpieces along said conveyor means.

30. Apparatus for coating workpieces comprising:

conveyor means including drive means for conveying workpieces in a given direction;

a spray assembly including a spray head for producing a liquid spray in a given pattern;

means for delivering a spray liquid to said spray head;

means for reciprocally mounting said spray assembly above said conveyor means to deliver a liquid spray from said spray head downwardly toward an upper surface of a workpiece arranged on the conveyor means, said spray assembly being movable in a reciprocating fashion along a path transverse to said given direction;

means for reciprocating said spray assembly as said workpieces are moved along the conveyor means;

microprocessor-based controller means including means for adjusting a moving speed of said conveyor means, means for adjusting a moving speed of said spray assembly, and means for adjusting outer limits of reciprocating movement of the spray assembly along said path according to size and/or arrangement of workpieces on the conveyor means to maximize efficient use of spray liquid and reduce waste thereof as well as facilitating setup changes of said apparatus to accommodate different coating thicknesses and workpieces of differing sizes.

31. The apparatus of claim 30 wherein said controller means further includes means for operating said conveyor means drive means, said means for delivering a spray liquid and said means for reciprocating so as to move workpieces beneath said spray assembly when said spray assembly is being reciprocated and is emitting a spray liquid.

32. The apparatus of claim 30 wherein said controller means further includes means for operating said conveyor means drive means, said means for delivering a spray liquid and said means for reciprocating so as to form a substantially Z-shaped spray pattern of liquid spray on a workpiece.

33. The apparatus of claim 30 wherein said controller means further includes means for operating said conveyor means drive means, said means for delivering a spray liquid and said means for reciprocating so as to cover a given area on a workpiece, a width of said given area being controlled by adjusting outer limits of a reciprocating range of said spray head.

34. Apparatus for coating at least one surface of workpieces comprising:

conveyor means including motor means for conveying workpieces in a given direction;

a spray assembly including a spray head for producing a liquid spray in a given pattern;

means for delivering a spray liquid to said spray assembly;

means for reciprocally mounting said first spray assembly to deliver a liquid spray from said spray head toward a surface of a workpiece arranged on the conveyor means, means for moving said first spray assembly in a reciprocating fashion along a path transverse to said given direction as spray liquid is being sprayed on moving workpieces by said spray assembly; and microprocessor-based controller means including means for adjusting a moving speed of said conveyor means, means for adjusting a moving speed of said spray assembly, and means for adjusting outer limits of reciprocating movement of the spray assembly along said path according to size and/or arrangement of workpieces on the conveyor means to maximize efficient use of spray liquid and reduce waste thereof as well as facilitating setup changes of said apparatus to accommodate different coating thicknesses and workpieces of differing sizes.

* * * * *